United States Patent
Paley

(10) Patent No.: US 7,275,140 B2
(45) Date of Patent: *Sep. 25, 2007

(54) FLASH MEMORY MANAGEMENT METHOD THAT IS RESISTANT TO DATA CORRUPTION BY POWER LOSS

(75) Inventor: Alexander Paley, Kfar Saba (IL)

(73) Assignee: SanDisk IL Ltd., Kfar Saba (IL)

( * ) Notice: Subject to any disclaimer, the term of this patent is extended or adjusted under 35 U.S.C. 154(b) by 0 days.

This patent is subject to a terminal disclaimer.

(21) Appl. No.: 11/370,942

(22) Filed: Mar. 9, 2006

(65) Prior Publication Data

US 2006/0259718 A1    Nov. 16, 2006

Related U.S. Application Data

(60) Provisional application No. 60/679,825, filed on May 12, 2005.

(51) Int. Cl.
*G06F 13/00* (2006.01)
(52) U.S. Cl. .................. 711/159; 711/156; 711/165
(58) Field of Classification Search ............... 711/156, 711/159, 165
See application file for complete search history.

(56) References Cited

U.S. PATENT DOCUMENTS

| | | | |
|---|---|---|---|
| 5,043,940 A | 8/1991 | Harari | 365/168 |
| 5,095,344 A | 3/1992 | Harari | 357/23.5 |
| 5,404,485 A | 4/1995 | Ban | 395/425 |
| 5,937,425 A | 8/1999 | Ban | 711/103 |
| 6,456,528 B1 | 9/2002 | Chen | 365/185.03 |
| 6,522,580 B2 | 2/2003 | Chen et al. | 365/185.02 |
| 6,678,785 B2 | 1/2004 | Lasser | 711/103 |
| 6,977,847 B2* | 12/2005 | Lasser et al. | 365/185.33 |
| 6,988,175 B2* | 1/2006 | Lasser | 711/156 |
| 2004/0193564 A1 | 9/2004 | Ban et al. | 707/1 |

* cited by examiner

*Primary Examiner*—Reba I. Elmore
(74) *Attorney, Agent, or Firm*—Mark M. Friedman

(57) ABSTRACT

The present invention includes a method of managing page-based data storage media such as flash media, a system that uses the method, and a computer-readable storage medium bearing code for implementing the method. For each page, a corresponding risk zone, of other pages whose data are put at risk of corruption if writing to the page is interrupted, is identified. When a page is selected for writing new data, the written pages in its risk zone are copied to a log. As necessary, corrupt data are replaced with corresponding data from the log.

26 Claims, 7 Drawing Sheets

| | | |
|---|---|---|
| 0 | PAGE 32 | } 34 |
| 1 | PAGE 32 | |
| 2 | PAGE 32 | } 34 |
| 3 | PAGE 32 | |
| 4 | PAGE 32 | } 34 |
| 5 | PAGE 32 | |
| 6 | PAGE 32 | } 34 |
| 7 | PAGE 32 | |
| 8 | PAGE 32 | } 34 |
| 9 | PAGE 32 | |
| 10 | PAGE 32 | } 34 |
| 11 | PAGE 32 | |
| 12 | PAGE 32 | } 34 |
| 13 | PAGE 32 | |
| 14 | PAGE 32 | } 34 |
| 15 | PAGE 32 | |
| 16 | PAGE 32 | } 34 |
| 17 | PAGE 32 | |
| 18 | PAGE 32 | } 34 |
| 19 | PAGE 32 | |
| 20 | PAGE 32 | } 34 |
| 21 | PAGE 32 | |
| 22 | PAGE 32 | } 34 |
| 23 | PAGE 32 | |
| 24 | PAGE 32 | } 34 |
| 25 | PAGE 32 | |
| 26 | PAGE 32 | } 34 |
| 27 | PAGE 32 | |
| 28 | PAGE 32 | } 34 |
| 29 | PAGE 32 | |
| 30 | PAGE 32 | } 34 |
| 31 | PAGE 32 | |
| 32 | PAGE 32 | } 34 |
| 33 | PAGE 32 | |
| 34 | PAGE 32 | } 34 |
| 35 | PAGE 32 | |
| 36 | PAGE 32 | } 34 |
| 37 | PAGE 32 | |
| 38 | PAGE 32 | } 34 |
| 39 | PAGE 32 | |
| 40 | PAGE 32 | } 34 |
| 41 | PAGE 32 | |
| 42 | PAGE 32 | } 34 |
| 43 | PAGE 32 | |
| 44 | PAGE 32 | } 34 |
| 45 | PAGE 32 | |
| 46 | PAGE 32 | } 34 |
| 47 | PAGE 32 | |
| 48 | PAGE 32 | } 34 |
| 49 | PAGE 32 | |
| 50 | PAGE 32 | } 34 |
| 51 | PAGE 32 | |
| 52 | PAGE 32 | } 34 |
| 53 | PAGE 32 | |
| 54 | PAGE 32 | } 34 |
| 55 | PAGE 32 | |
| 56 | PAGE 32 | } 34 |
| 57 | PAGE 32 | |
| 58 | PAGE 32 | } 34 |
| 59 | PAGE 32 | |
| 60 | PAGE 32 | } 34 |
| 61 | PAGE 32 | |
| 62 | PAGE 32 | } 34 |
| 63 | PAGE 32 | |

30

FLASH MEMORY MANAGEMENT METHOD THAT IS RESISTANT TO DATA CORRUPTION BY POWER LOSS

This patent application claims the benefit of U.S. Provisional Patent Application No. 60/679,825, filed May 12, 2005

FIELD AND BACKGROUND OF THE INVENTION

The present invention relates to a method of managing a flash memory and, more particularly, to a method, of managing a multi-level cell flash memory, that is resistant to data corruption when power is interrupted unexpectedly.

Flash memory is a form of EEPROM (electronically erasable programmable read-only memory) non-volatile memory. FIG. 1A is a high level schematic block diagram of a generic flash-based data storage device 10 that is used by a host device (not shown) for storing data in one or more NAND flash media 12. The operation of device 10 is controlled by a microprocessor-based controller 14 with the help of a random access memory (RAM) 16 and an auxiliary non-volatile memory 18. For this purpose, flash device 10 and the host system communicate via a communication port 20 in flash device 10. Typically, for backwards compatibility with host devices whose operating systems are oriented towards block memory devices such as magnetic hard disks, flash device 10 emulates a block memory device, using firmware stored in auxiliary non-volatile memory 18 that implements flash management methods such as those taught by Ban in U.S. Pat. No. 5,404,485 and U.S. Pat. No. 5,937,425, both of which patents are incorporated by reference for all purposes as if fully set forth herein. The components of device 10 are housed together in a common housing 15.

Other devices that use NAND flash media to store data are known. FIG. 1B shows a personal computer 10' in which NAND flash media 12 are used in addition to, or as a substitute for, a magnetic hard disk for long-term non-volatile data storage. Controller 14 now represents the central processing unit of personal computer 10'. Auxiliary non-volatile memory 18 now represents all of the other non-volatile memories of personal computer 10', including a BIOS in which boot code is stored and a magnetic hard disk for storing the operating system, including the flash management system, of personal computer 10' (unless NAND flash media 12 are a substitute for a magnetic hard disk, in which case the operating system is stored in NAND flash media 12). NAND flash media 12, controller 14, RAM 16, auxiliary non-volatile memory 18 and other components (not shown) of personal computer 10' communicate with each other via a bus 19. In some configurations of personal computer 10', NAND flash media 12 are on a removable card. In other configurations of personal computer 10', the illustrated components are integrated in a single unitary physical device, so that NAND flash media 12 are not a physically separate entity.

The operations that controller 14 performs on NAND flash media 12 include read operations, write operations and erase operations. NAND Flash media 12 typically are written in units called "pages", each of which typically includes between 512 bytes and 2048 bytes, and typically are erased in units called "blocks", each of which typically includes between 16 and 64 pages. Note that the use of the word "block" to refer to the erasable units of NAND flash media 12 should not be confused with the use of the word "block" in the term "block memory device". The "block" nature of a block memory device refers to the fact that the device driver exports an interface that exchanges data only in units that are integral multiples of a fixed-size unit that typically is called a "sector".

To facilitate the management of NAND flash media 12, controller 14 assigns each page a status of "unwritten" or "written". A page whose status is "unwritten" is a page that has not been written since the last time it was erased, and so is available for writing. A page whose status is "written" is a page to which data have been written and not yet erased. In some embodiments of device 10, controller 14 also assigns some pages a status of "deleted". A page whose status is "deleted" is a page that contains invalid (typically superseded or out of date) data. In embodiments of device 10 that support "deleted" pages, the "written" status is reserved for pages that contain valid data. Herein, a page whose status is "unwritten" is called an "unwritten page", a page whose status is "written" is called a "written page" and a page whose status is "deleted" is called a "deleted page".

Because device 10 is used for non-volatile data storage, it is vital that device 10 retain the data written thereto under all circumstances. A major risk to the integrity of data stored in device 10 is a sudden power failure in which the power source to device 10 is interrupted with no prior notice while device 10 is in the middle of an operation. Often such a power failure causes the interrupted operation to have erratic or unpredictable results.

If the power failure occurs while device 10 is in the middle of an operation that changes the contents of NAND flash media 12, for example in the middle of writing a page of data or in the middle of erasing a block, the contents of the interrupted page or block are unpredictable after device 10 has been powered up again and indeed may be random. This is because some of the affected bits may have gotten to the state assigned to them by the operation by the time power was interrupted, while other bits were lagging behind and not yet at their target values. Furthermore, some bits might be caught in intermediate states, and thus be in an unreliable mode in which reading these bits will return different results in different read operations.

This problem is handled well by many prior art flash management software systems, for example the TrueFFS™ flash management system used by M-Systems Flash Disk Pioneers Ltd. of Kfar Saba, Israel. The reason that these prior art systems can defend against this problem is that the data corruption is localized to the page or block being modified when the power failure occurs. All the other pages in NAND flash media 12 keep their contents and do not become corrupted. Therefore, in the case of an interrupted write operation, prior art flash management systems can assume the validity of all other pages and concentrate on the last page written. There are several approaches that can be used.

One approach is to store a pointer, to the page to be written or to the block to be erased, in a predetermined location before the operation, so that when device 10 powers up again, controller 14 can look up this pointer and immediately know which page or block was the last one targeted. This method usually uses one or more validity flags that signal to controller 14 whether the operation completed successfully. See for example U.S. Pat. No. 6,977,847, which is incorporated by reference for all purposes as if fully set forth herein. That patent application teaches an example of such a method for protecting against power loss during erasing.

Another approach is to limit the locations where data may be written at any given time to only a subset of the pages. Controller 14 then can consider all such locations as potentially corrupt, and can avoid using the data stored therein upon powering up. Alternatively, controller 14 can subject the data to a "validity test" before trusting them as not corrupted. An example of a flash management method to which this approach can be applied is taught in U.S. Pat. No. 6,678,785, which is incorporated by reference for all purposes as if fully set forth herein. According to U.S. Pat. No. 6,678,785, the writing algorithm is limited to writing new pages in sequential order within each block. Therefore, on power up it is known that the last page written in any given block was the highest numbered written page in that block.

Other systems are not amenable to such shortcuts, and a brute force method of identifying suspect pages might be used. Nevertheless, the handling of the power-loss data corruption problem is made relatively easy by the knowledge that only the data in the last written page might have been corrupted and that the data stored in all the other pages are reliable.

It should be pointed out that the above discussion applies to the validity of pages as stand-alone entities. It is another question altogether whether the system as a whole is valid even if no page write was interrupted Such problems can occur, for example, in file systems in which a user-level operation consists of several page-level operations. For example, the creation of a new file involves writing a directory entry, writing one or more sector allocation tables and only then writing the actual file data. If only sonic of these write operations are completed by the time power fails, while the remaining write operations have yet to begin, then no page is corrupted but the file system as a whole is corrupted Methods for protecting against such problems are known (see for example co-pending U.S. patent application Ser. No. 10/397,378) but are beyond the scope of the present invention.

Recently, NAND flash media 12 have come into use for which the above assumptions about the locality of data corruption upon power loss are not valid. Examples of such NAND flash media 12 include the Multi-Level Cell (MLC) NAND flash devices of Toshiba (e.g. the TC58DVG04B1FT00). In such devices, each cell stores two bits rather than one bit. The internal arrangement of that device is such that a physical page resides within a group of 528×8=4224 cells. But while in other devices such a group of cells stores one page of 528 bytes, in the Toshiba MLC NAND flash devices such a group of cells stores two such pages of data. Such a group of cells, that stores two or more pages of data, is called a "superpage" herein.

FIG. 2 is a schematic illustration of a block 30 of one such MLC NAND flash device. Block 30 includes 64 pages 32, with respective logical addresses 0 through 63, in 32 superpages 34. The logical addresses of pages 32 are shown in FIG. 2 in a column on the left side of block 30.

Now consider the following sequence of events:

1. One of the pages 32 of a two-page superpage 34 is written successfully, with the other page not being written.

2. A write to the other page 32 of the two-page superpage 34 is interrupted by a power loss.

Because the two pages 32 of this superpage 34 share the same physical cells, the power loss could corrupt both pages 32. To understand how both pages 32 could be corrupted it is necessary to consider how bits are encoded within an MLC flash cell. One method of encoding bits in MLC flash cells is taught by Harari in U.S. Pat. No. 5,095,344 and in U.S. Pat. No. 5,043,940. According to this method, bits are encoded in a MLC flash cell by injecting different amounts of electrical charge into the floating gate of a flash cell, thereby producing different levels of a threshold voltage $V_{T1}$ of the cell. The following table shows the values of the two bits stored in the cell as a function of threshold voltage:

| $V_{T1}$ | Value of bit 1 | Value of bit 2 |
| --- | --- | --- |
| −3.0 V | 1 | 1 |
| −0.5 V | 1 | 0 |
| +2.0 V | 0 | 1 |
| +4.5 V | 0 | 0 |

In practice, the four possible bit combinations of a two-bit flash cell are stored as four different threshold voltage ranges. In the above example, the threshold voltage ranges are +3.25V to +5.75V for (0,0), +0.75V to +3.25V for (0,1), −1.75V to +0.75V for (1,0) and −4.25V to −1.75V for (1,1). Because changing either one of the two bits involves changing the same physical attribute (i.e., the threshold voltage) of the cell, it is clear that the process of changing one bit shifts the other bit from its previously stable state. If the change does not complete correctly, it might result in a wrong interpretation for the value of either or both bits.

The true difficulty in defending against this problem arises because the two pages 32 of a superpage 34 might be written at two different, widely separated times. Conceivably, a first page 32 of a superpage 34, that was written at a certain time, could be corrupted many years later by an incomplete write to the second page 32 of that superpage 34. Moreover, most file systems that sit on top of flash management systems may allocate pages 32 to files either contiguously or noncontiguously, so that pages 32 of the same superpage 34 could belong to totally unrelated files. A power loss during the update of one file could corrupt a totally unrelated file that would not be suspected of being at risk. Obviously, these conditions are beyond the capability of prior art flash management systems to deal with.

U.S. Pat. No. 6,988,175, which is incorporated by reference for all purposes as if fully set forth herein, solves this problem of power interruptions by adopting a policy for storing incoming data only into pages whose writing does not put other unrelated previously written data in other pages at risk. The methods of U.S. Pat. No. 6,988,175 are based on defining "risk zones" of pages whose data could be corrupted by interrupted writes. When one or more pages are selected for writing new data, the risk zone(s) of the page(s) selected for that write operation is/are checked to see if any of the other pages in that/those risk zone(s) might be storing valid data, i.e., if the status of any of the other pages in that/those risk zone(s) is "written". If any of the other pages in that/those risk zone(s) might in fact be storing valid data, then the selected page(s) is/are not written. Instead, the flash management system seeks a different page or pages for the write operation.

The risk zone of a page is defined in U.S. Pat. No. 6,988,175 as the set of other pages whose data are placed at risk of corruption when the page is written. For example, in FIG. 2, the risk zone of each page 32 is the other page 32 of that page 32's superpage 34. When one or more unwritten pages are selected for writing, the selected page or pages are written only if there are no written pages in any of their risk zones.

If the data to be written span more than one page, the targeted pages may be written either sequentially or in a random order. "Sequential" writing means that the pages of a block are written only in increasing logical address order, as in U.S. Pat. No. 6,678,785. "Random" writing means that the pages of a block may be written in any logical address order. The methods of both U.S. Pat. No. 6,988,175 and the present invention are equally applicable to both cases.

While the methods of U.S. Pat. No. 6,988,175 provide a solution to the problem of data corruption as a result of power interruption, they have two main disadvantages. The first disadvantage is that by avoiding writing into pages that are within the risk zones of previously written pages, we must skip those pages and leave them unused. This creates "holes" within the physical address space of the flash memory, where there are unused pages surrounded by written pages. For example in the case of FIG. 2 (and assuming sequential writing), after the user first has written page 0 the next data to be written into that block are directed into page 2, leaving page 1 unused. Therefore page 1 becomes a "hole" between pages 0 and 2. The creation of holes during the writing of data into the flash memory wastes valuable space and complicates the flash management software that must be ready to encounter these holes on reading and avoid interpreting these holes as containing valid data.

A second disadvantage of the methods of U.S. Pat. No. 6,988,175 is their relative inefficiency in handling flash devices in which the arrangement of the risk zones is not as symmetric as in FIG. 2. In FIG. 2 the risk zone of page number 20 is page number 21, and the risk zone of page number 21 is page number 20. Thus, we can view the pages as if they are divided into disjoint groups, where members of a group may risk each other, but they never risk pages outside their group. Pages 20 and 21 constitute one such group, and it is really the case that neither of them risks any other page outside their group. There are however flash memory devices where this is not the case—there are no "boundaries" which stop the "propagation of risk", like the boundary we have in FIG. 2 between pages 21 and 22. In those devices, every page puts at risk at least the page following it, and some pages even place at risk additional pages having higher addresses. Such complex risk zones structures may be created when a multi-level cell flash device implements techniques for reducing or eliminating interference between adjacent word-lines of its array of flash cells, where such techniques affect the writing order of the pages. An example for such techniques is disclosed by Chen et al. in U.S. Pat. No. 6,522,580 entitled "Operating Techniques For Reducing Effects Of Coupling Between Storage Elements Of a Non-Volatile Memory Operated in Multiple Data States", which patent is incorporated by reference for all purposes as if fully set forth herein. Applying the methods of U.S. Pat. No. 6,988,175 to such devices results in a highly inefficient utilization of the storage space—regardless of which page within the block is the target of our write operation, we must always skip at least one page and create a hole (except when starting to write at the very first page of a block).

There is thus a need for, and it would be highly advantageous to have, an improved flash management system, capable of dealing with power interruptions to NAND flash media 12 that are based on multi-level cells, that is efficient for a broad class of flash devices.

SUMMARY OF THE INVENTION

According to the present invention, instead of avoiding using risk zones of previously written pages, we do use the pages within the risk zones but back up the pages that are at risk before putting them at risk.

Therefore, according to the present invention there is provided a method of managing a memory that includes a plurality of pages, the method including the steps of: (a) identifying a respective risk zone of each page; (b) selecting at least one unwritten page for writing new data; and (c) for each unwritten page whose risk zone includes at least one written page, copying each written page to a log.

Furthermore, according to the present invention there is provided a data storage system, including: (a) a data storage medium including a plurality of pages; (b) a log; and (c) a controller for writing new data to the plurality of pages by steps including: (i) identifying a respective risk zone of each page of the plurality of pages; (ii) selecting at least one unwritten page of the plurality of pages for writing the new data; and (iii) for each unwritten page whose risk zone includes at least one written page of the plurality of pages, copying each written page to the log.

Furthermore, according to the present invention there is provided a computer-readable storage medium having computer-readable code embedded in the computer-readable storage medium, the computer readable code for writing new data to at least one of a plurality of pages of a data storage medium, the computer-readable code including: (a) program code for identifying a respective risk zone of each page; (b) program code for selecting at least one unwritten page for writing new data; and (c) program code for, for each unwritten page whose risk zone includes at least one written page, copying each written page to a log.

According to a basic method of the present invention for managing a memory, a respective risk zone of each page of the memory is identified. When new data are written to the memory, one or more unwritten pages is/are selected for writing the new data. The written pages, if any, in the risk zone(s) of the selected page(s) are copied to a log. The new data then are written to the selected page(s).

Preferably, if the new data span more than one page, the writing of the new data to the selected pages is effected substantially simultaneously.

Preferably, the copying of the written page(s) in the risk zone(s) and the writing of the new data to the selected page(s) are effected substantially simultaneously.

Preferably, for example when a system that includes the memory is powered up, data stored in the written pages of the memory are checked to determine if those data are corrupt. Data that are determined to be corrupt are replaced with corresponding data from the log. Most preferably, the checking is effected using an error detection code.

Alternatively, the new data that are written to the selected pages are so written only after all the written pages in the risk zone(s) have been copied to the log. When a written page is copied to the log, a corresponding flag is set. After the new data that are to be written to the selected pages whose risk zones include that written page have been so written, the flag is cleared. Later, for example when a system that includes the memory is powered up, data stored in written pages that correspond to set flags are replaced with corresponding data from the log.

If the new data span more than one page, the selected unwritten pages are written either sequentially or in random order.

Preferably, the writing of the new data to the selected pages and the copying of written pages to the log are effected using different respective modes. Most preferably, the mode that is used for the copying writes fewer bits per cell of the memory than the mode that is used for the writing. For example, in one embodiment of the present invention that is discussed below, the copying is done in Single-Level Cell mode and the writing is done in Multi-Level Cell mode.

Preferably, all the risk zones include an equal number of pages, for example one page per risk zone. Alternatively, at least two of the risk zones include different numbers of pages.

A basic data storage system of the present invention includes a data storage medium with a plurality of pages, a log and a controller. To write new data to the plurality of pages, the controller identifies respective risk zones of the pages and selects from among the pages at least one unwritten page. The controller copies the written pages, if any, in the risk zone(s) of the selected page(s) to a log.

Preferably, the data storage medium is a non-volatile memory such as a flash memory. Preferably, such a flash memory includes a plurality of multi-level cells. Also preferably, such a flash memory includes a plurality of blocks, with each block including a respective subplurality of the plurality of pages. In alternative preferred embodiments of the present invention, the controller writes the new data to the pages of each block either only sequentially or in a random order.

Preferably, the log is part of the data storage medium.

Preferably, the controller writes the new data to the selected unwritten page(s). More preferably, the copying and the writing are effected using different respective writing modes. Most preferably, the writing mode used to copy the written page(s) writes fewer bits per cell of the data storage medium than the writing mode used to write the new data.

The scope of the present invention also includes a computer-readable storage medium in which is embodied computer-readable code for writing new data to the pages of a data storage medium according to the basic method of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of managing a page-based memory so as to prevent the corruption of data in previously written pages by an interrupted write operation. Specifically, the present invention can be used to manage flash memories with multi-level cells.

The principles and operation of memory management according to the present invention may be better understood with reference to the drawings and the accompanying description.

We again refer to FIG. 2, but now take an example in which the rules defining the risk zones are different than before—the risk zone of page number N of a block is composed of pages N-2 and N-2 (except for the first two pages of the block—the risk zone of page 1 is page 0 and the risk zone of page 0 is empty). It should be emphasized that the risk zones of different pages need not all be the same size as is the case for pages past page 1 in the above example. It may be that some pages have a risk zone of two pages, while other pages have a risk zone of three pages. Some pages may also have risk zones that go both ways—backward and forward, and not just backward as in the above example. The methods of the present invention are not limited to the above example, but for the sake of simplicity the explanations below are given in the context of this simple example.

Figure 3:
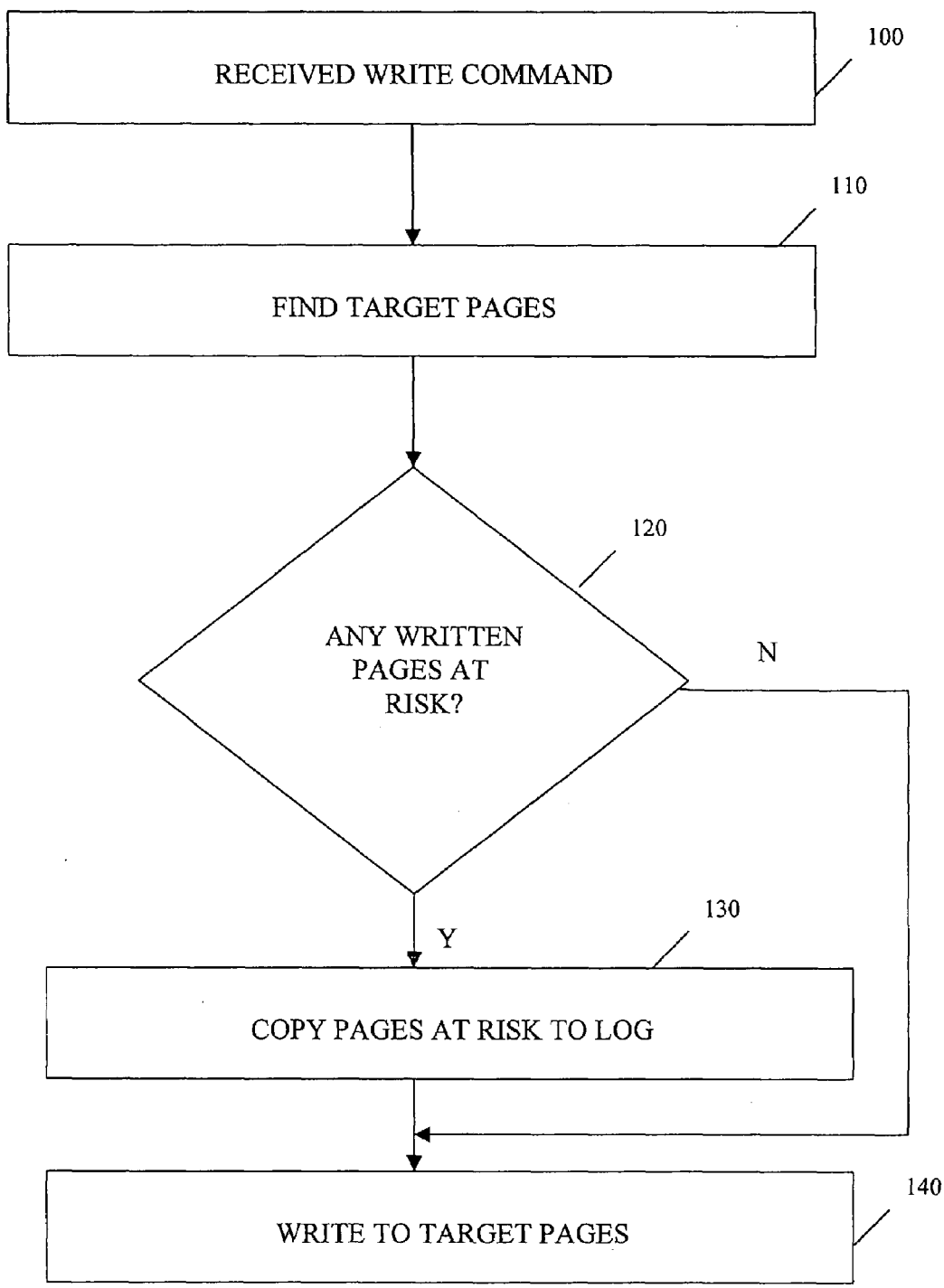
FIG. 3 is a flow chart of writing new data to a memory according to the present invention.

FIG. 3 shows how a write command is handled according to the methods of the present invention. In step 100 a write command is received for writing data into the storage system, the data being either for a single page or multiple pages. In step 110 a physical location to which the data are to be written is located. Locating the physical pages into which to write is done by the flash management system according to the specific algorithms of that system. Different flash management systems, such as those disclosed in U.S. Pat. No. 6,678,785 or in U.S. Pat. No. 5,937,425, use different methods for mapping the host computer's targeted logical addresses into physical addresses, but the methods of the present invention are equally applicable to all such mapping methods.

For simplicity we assume here that the physical pages located in step 110 as the target physical addresses all reside within one block. If this is not the case, the same logic separately applies to each subgroup of those physical pages that is contained within the same block.

Figure 2:
FIG. 2 is a schematic illustration of an exemplary embodiment of a block of a multi-level-cell flash memory.

In step 120 it is checked if writing into the target physical pages puts at risk some previously written pages. This is done by finding out which previously written pages are contained within the risk zones of at least one of the target pages. For example, assume that pages 0 to 20 of FIG. 2 are already written, with pages 21 to 63 free for use. A command is received for writing 5 pages, and pages 21 to 25 are located as the target physical pages to write into. Looking for previously written pages put at risk we find that:

a. pages 19 and 20 are within the risk zone of page 21;
b. page 20 is within the risk zone of page 22;
c. page 23 contains no written page within its risk zone;
d. page 24 contains no written page within its risk zone;
e. page 25 contains no written page within its risk zone.

The conclusion is that written pages 19 and 20 are put at risk by the write operation, but none of pages 0 to 18 is at risk. One should note that the methods of the present invention are not the same as the methods of U.S. Pat. No. 6,988,175, even though both rely on the same concept of risk zones. In both methods one asks "does this target page has a previously written page contained within its risk zone?". But in U.S. Pat. No. 6,988,175 the intention is "if there are written pages within the risk zones of the target pages, we skip the target pages", while in the present invention the intention is "if there are written pages within the risk zones of the target pages, we back up the written pages".

If the answer to the question of step 120 is that there are no previously written pages put at risk (for example if the block is still completely unused), we move directly to step 140 in which the new data are written into the target physical pages. If however the answer to the question is that there are pages at risk, we go via step 130. In step 130 the pages that are at risk (pages 19 and 20 in the above example) are copied into a back-up log. Only then do we get to step 140 and write the new data into the target physical pages.

Figure 4:
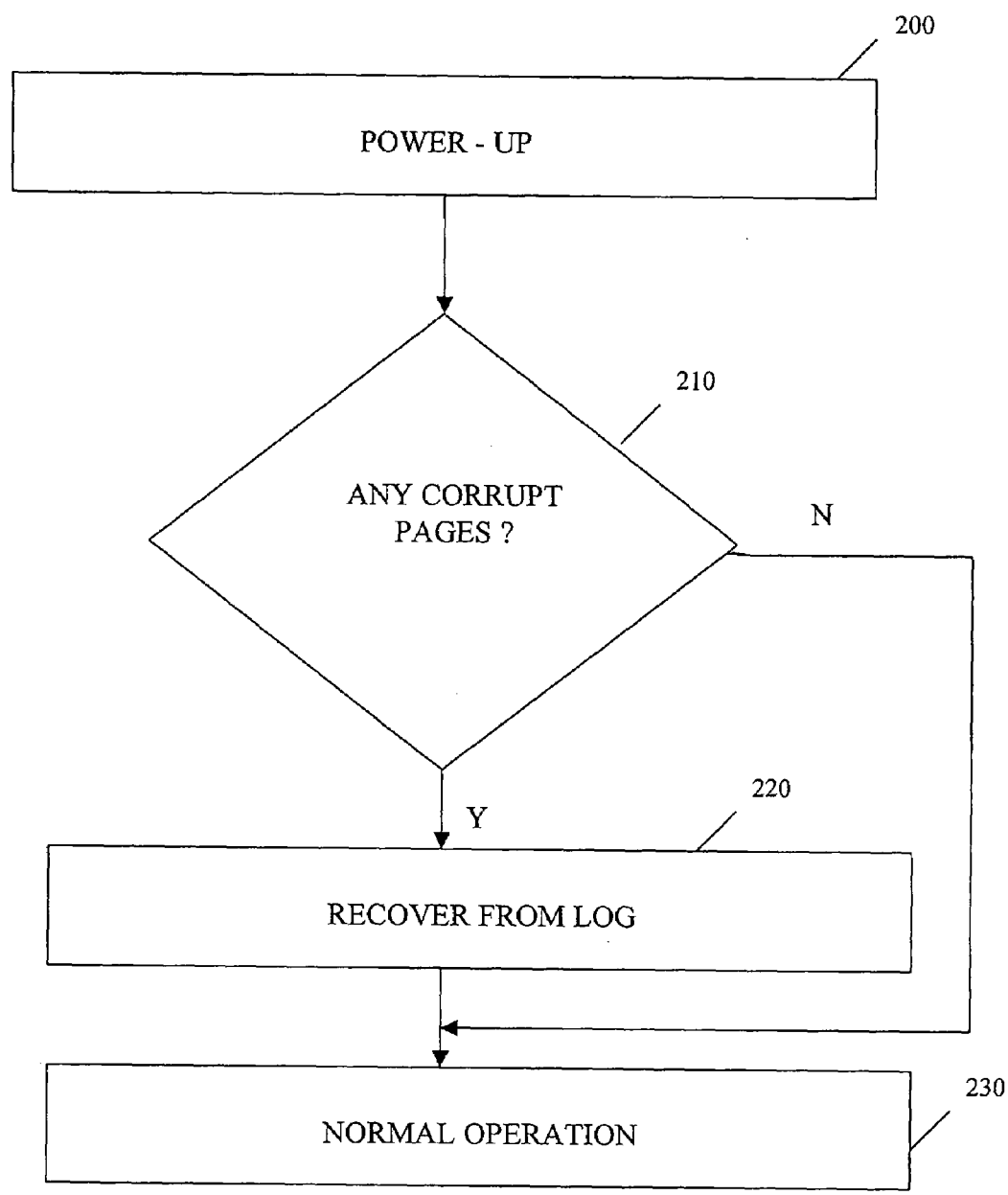
FIG. 4 is a flow chart of restoration of corrupt data on power-up according to the present invention.

FIG. 4 shows how the back-up log is used for recovering from data corruption caused by power loss. In step 200 the storage system is powered up. In step 210 it is checked whether any pages are corrupted as a result of power loss. This may be done by activating the Error Detection Codes (EDC) typically associated with each page of data. By reading the page contents and calculating the resulting syndrome, one finds out whether the stored data are valid or not. If no corrupted pages are found, the system continues with normal operation in step 230. If however at least one page is found corrupted, step 220 recovers the corrupted data from the back-up log into which that data were stored prior to the write operation and writes those data to one or more unwritten pages as illustrated in FIG. 3.

One should note that these methods guarantee the recovery of the previously written pages but not of the pages written by the last write command. If, in the above example, the power fails in the middle of writing page 21, then pages 19 and 20 are guaranteed to be valid and not corrupted once the recovery procedure of FIG. 4 is completed. But page 21 is not backed up and cannot be recovered even if found to be corrupted. This however is what we wanted to achieve—the protection of data previously stored into the system, not of the current new data whose writing is unexpectedly interrupted.

A variation on the above methods is to have each page in the back-up log be associated with a flag indicating whether the page is still needed for back-up. When writing a page into the back-up log in FIG. 3 we initially set the flag to "needed". After completing the write operation, all pages copied into the back-up log by the current operation are set to "not needed". If a power failure occurs in the middle of the write operation, the pages in the back-up log are left with a "needed" flag, while if the operation completed successfully the pages are left with a "not needed" flag. On power-up, the flags of the last pages in the back-up log are checked—if at least one page is found to be "needed" we know a power failure had occurred and we perform recovery for the blocks containing the "flagged" pages. This variation of the method provides a more reliable detection of data corruption than by relying on EDC techniques in which it is theoretically possible that random corrupted data will not be identified as such by the EDC.

The back-up log may be implemented in any way known in the prior art for implementing a log. One implementation writes the backed-up pages sequentially into the flash area allocated for the log, going back to the beginning of the area once the end of the area is reached. House-keeping operations for garbage-collecting no-longer-needed blocks must also be taken care of. One must be careful though that no power interruption corrupts the back-up log. This is achieved with the methods of U.S. Pat. No. 6,988,175, so that some physical pages in the log are skipped to ensure that no backed-up page is ever at risk. Alternatively, the log is written using a different writing mode of the flash media, a mode that is immune to power-failure data corruption by having no risk zones. An example is a flash system using flash memory devices providing both Multi-Level Cell (MLC) and Single-Level Cell (SLC) modes. Such a device is disclosed by Chen in U.S. Pat. No. 6,456,528, which patent is incorporated by reference as if fully set forth herein. While the regular data stored in the system are written using the "risky" MLC mode for achieving high storage density, the back-up log is written using the safe SLC mode that creates no risk zones. This also has the additional advantage of decreasing the overhead time spent on writing the back-up log, as SLC writing is much faster than MLC writing.

It should be noted that the above methods are highly efficient when the write command is for writing a large number of pages. Typically in such case the number of previously written pages that should be backed-up is much smaller than the number of written pages, and therefore the relative overhead per written page is smaller the larger the number of pages in the command. Writing of multiple pages as the result of a single command is considered herein to be "simultaneous" writing of these pages.

Comparing the methods of the present invention to U.S. Pat. No. 6,988,175 one sees that the present invention in superior to U.S. Pat. No. 6,988,175 insofar as the present invention does not leave unused gaps within the used blocks and never skips pages. The present invention is thus much better than U.S. Pat. No. 6,988,175 in the efficiency of space utilization of the flash memory, and is also easier to handle by flash management systems that do not have to deal with gaps that complicate their logic. Additionally, the present invention is efficiently applicable to any kind of risk zone patterns, unlike U.S. Pat. No. 6,988,175 which is quite inefficient in many cases, including the example presented above.

Figure 1A:
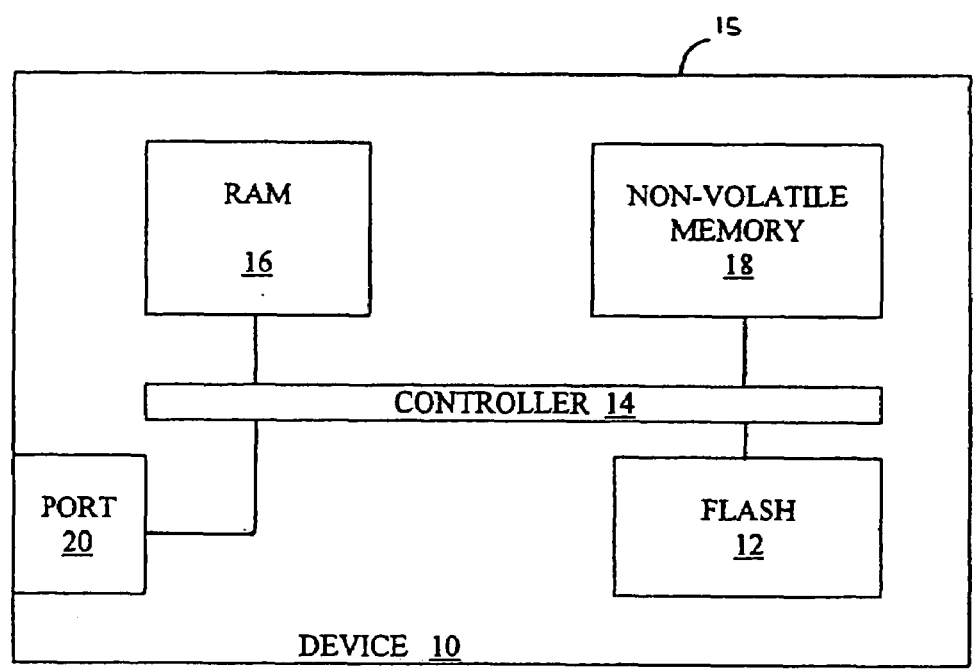
FIGS. 1A and 1B are high-level schematic block diagrams of prior art devices that use NAND flash media for non-volatile data storage.
Figure 5A:
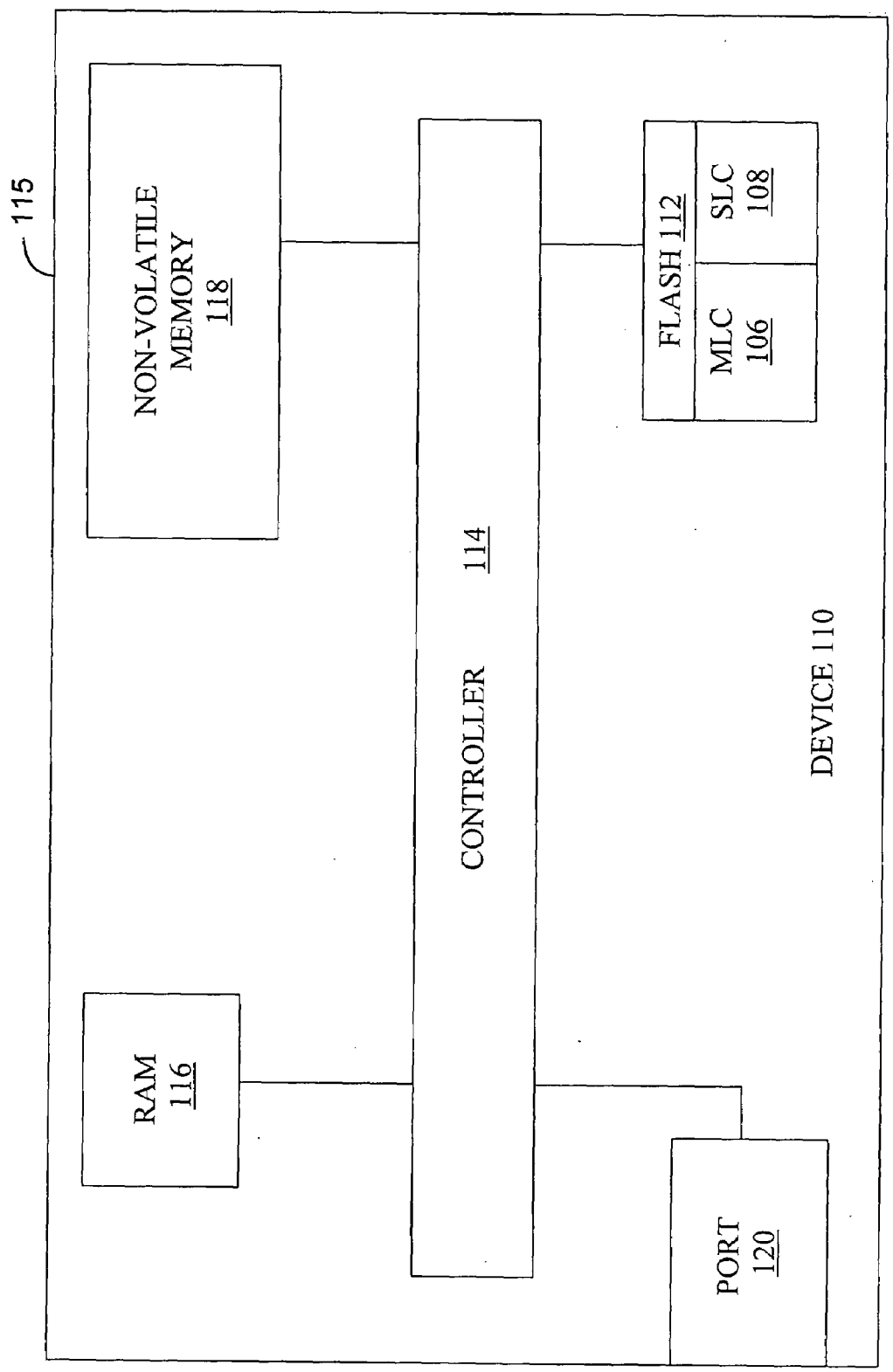
FIGS. 5A and 5B are high-level schematic block diagrams of the devices of FIGS. 1A and 1B as modified according to the present invention.

FIG. 5A is a high-level schematic block diagram of a flash-based storage device 110 of the present invention that, like prior art device 10 of FIG. 1A, is used by a host device for storing data in one or more NAND flash media 112. The operation of device 110 is controlled by a microprocessor-based controller 114 with the help of a RAM 116 and an auxiliary non-volatile memory 118. For this purpose, flash device 110 and the host system communicate via a common communication port 120 in flash device 110. The components of device 110 are housed together in a common housing 115.

Like prior art device 10, flash device 110 emulates a block memory device, using firmware stored in auxiliary non-volatile memory 118. To protect those data against corruption in case of power failure, the firmware stored in auxiliary non-volatile memory 118 also includes code for copying data at risk for corruption to and from a back-up log in accordance with the methods of the present invention. NAND flash media 112 are partitioned into a MLC portion 106 that is used for regular data storage and a SLC portion 108 that is used for the back-up log. The present invention allows the software application of the host device, be it a file management application or any other software application, to freely send write commands to such a device 110 of the present invention in any random order, and allows the software application to ignore the risk relations among the pages of NAND flash media 112. The methods of the present invention provide full protection against power loss in the sense that the only pages that might be corrupted when a power loss interrupts a write command are the pages being written by the interrupted write command. All other pages are guaranteed to remain valid.

Figure 1B:
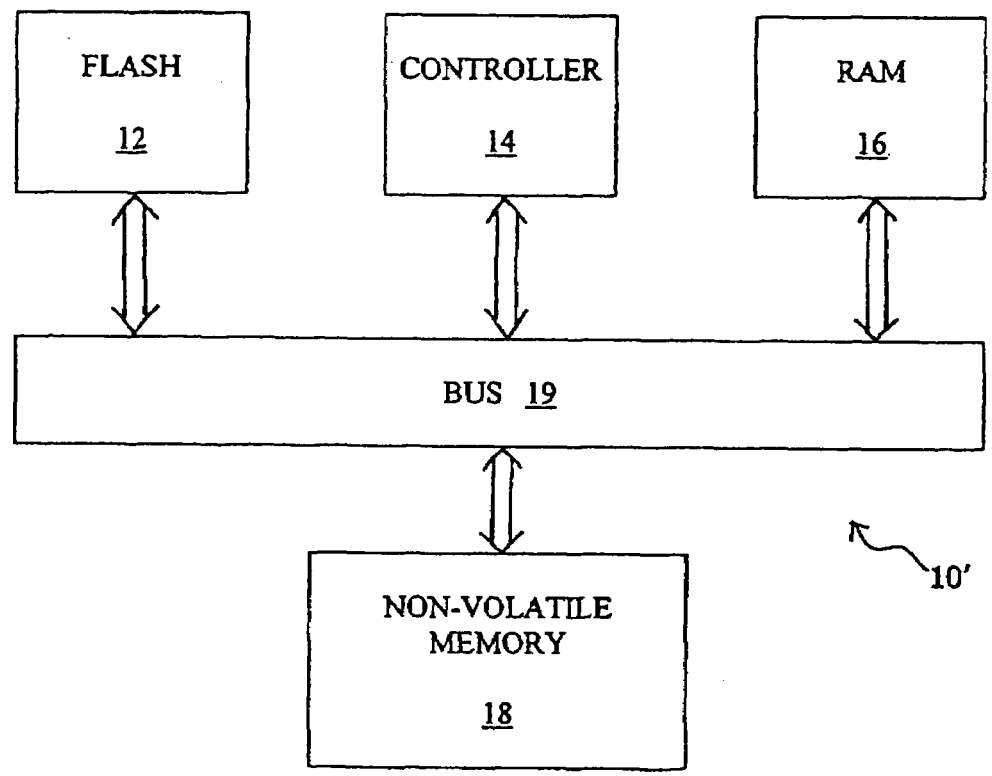
Figure 5B:
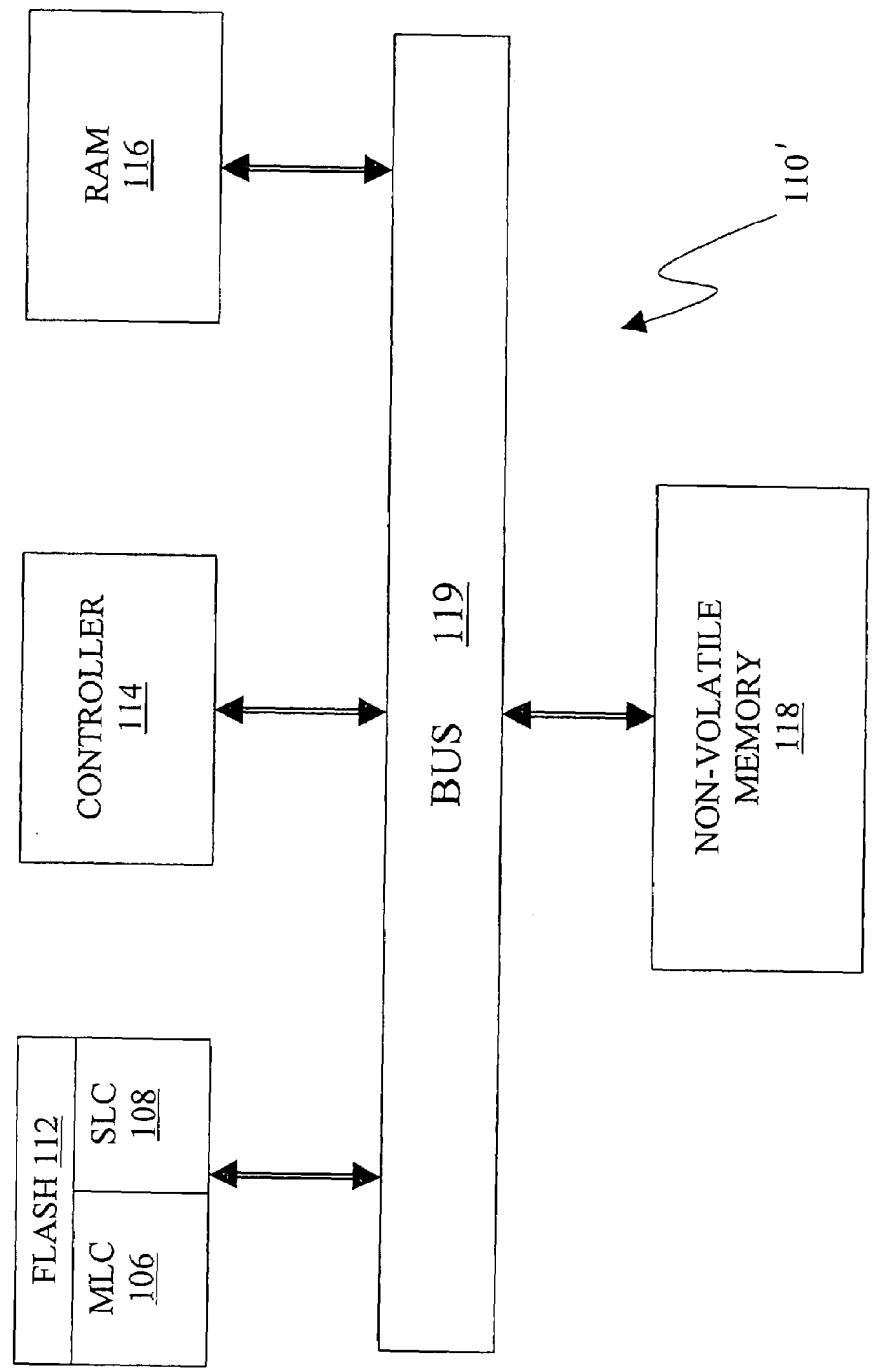

FIG. 5B is a high-level partial schematic block diagram of a personal computer 110', similar to prior art personal computer 10' of FIG. 1B, in which NAND flash media 112 are used in addition to, or as a substitute for, a magnetic hard disk for long-term non-volatile data storage. Controller 114 now represents the central processing unit of personal computer 110'. Auxiliary memory 118 now represents all of the other non-volatile memories of personal computer 110', including a BIOS in which boot code is stored and a magnetic hard disk for storing the operating system, including the flash management system, of personal computer 110' (unless NAND flash media 112 are a substitute for a magnetic hard disk, in which case the operating system is stored in NAND flash media 112). NAND flash media 112, controller 114, RAM 116, auxiliary non-volatile memory 118 and other components (not shown) of personal computer 110' communicate with each other via a bus 119.

The flash management software stored in auxiliary non-volatile memory 118 or in NAND flash media 112 as part of the operating system code of personal computer 110' and executed by controller 114 includes code for implementing the flash management methods of the present invention to preclude corruption of data previously stored in MLC portion 106 of NAND flash media 112 in case a write operation to NAND flash media 112 is interrupted by a power failure. Specifically, data at risk for corruption are copied to and from a back-up log in SLC portion 108 of NAND flash media 112 as described above.

Auxiliary non-volatile memories 118 of devices 110 and 110' (and NAND flash media 112 of device 110' in the embodiment of device 110' in which the operating system is stored in NAND flash media 112) are examples of computer-readable storage media in which is embodied computer-readable code for implementing the methods of the present invention.

While the invention has been described with respect to a limited number of embodiments, it will be appreciated that many variations, modifications and other applications of the invention may be made.

What is claimed is:

1. A method of managing a memory that includes a plurality of pages, at least a portion of the pages having respective risk zones, the method comprising the steps of:
   (a) selecting at least one unwritten page for writing new data;
   (b) for each said unwritten page whose risk zone includes at least one written page, copying each said written page to a log that is separate from said at least one unwritten page; and
   (c) writing said new data to said at least one unwritten page.

2. The method of claim 1, wherein, if said new data span more than one page, said writing is effected substantially simultaneously.

3. The method of claim 1 wherein said copying and said writing are effected substantially simultaneously.

4. The method of claim 1, further comprising the steps of:
   (d) checking whether data stored in at least one written page are corrupt; and
   (e) if said data are corrupt, replacing said data with corresponding data from said log.

5. The method of claim 4, wherein said checking is effected using an error detection code.

6. The method of claim 4, wherein said checking and said replacing are effected when a system that includes the memory is powered up.

7. The method of claim 1, wherein said new data that are written to an unwritten page are written to said unwritten page only after every written page of said risk zone of said unwritten page have been copied to said log, the method further comprising the steps of: for each written page that is copied to said log:
   (d) setting a corresponding flag; and
   (e) after said new data, that are to be written to said at least one unwritten page whose risk zone includes said each written page, have been written to every said at least one unwritten page whose risk zone includes said each written page: clearing said corresponding flag.

8. The method of claim 7, further comprising the step of:
   (f) for each said flag that is set: replacing data stored in said written page that corresponds to said each flag with corresponding data from said log.

9. The method of claim 8, wherein said replacing is effected when a system that includes the memory is powered up.

10. The method of claim 1, wherein, if said new data span more than one page, said selected unwritten pages are written sequentially.

11. The method of claim 1, wherein, if said new data span more than one page, said selected unwritten pages are written in a random order.

12. The method of claim 1, wherein said copying and said writing are effected using different respective writing modes.

13. The method of claim 1, wherein all said risk zones include an equal number of pages.

14. The method of claim 13, wherein each said risk zone includes one page.

15. The method of claim 1, wherein at least two said risk zones include different numbers of pages.

16. A data storage system, comprising:
   (a) a data storage medium including a plurality of pages, at least a portion of said pages having respective risk zones;
   (b) a log; and
   (c) a controller for writing new data to said plurality of pages by steps including:
      (i) selecting at least one unwritten page of said plurality of pages for writing said new data, said at least one unwritten page being separate from said log;
      (ii) for each said unwritten page whose risk zone includes at least one written page of said plurality of pages, copying each said written page to said log, and
      (iii) writing said new data to said at least one unwritten page of said plurality of pages.

17. The data storage system of claim 16, wherein said data storage medium is non-volatile.

18. The data storage system of claim 17, wherein said data storage medium is a flash memory.

19. The data storage system of claim 18, wherein said flash memory includes a plurality of multi-level cells.

20. The data storage system of claim 18, wherein said flash memory includes a plurality of blocks, such that each block of said plurality of blocks includes a respective subplurality of said plurality of pages, and wherein said controller writes said new data to said pages of each said block only sequentially.

21. The data storage system of claim 18, wherein said flash memory includes a plurality of blocks, such that each block of said plurality of blocks includes a respective subplurality of said plurality of pages, and wherein said controller writes said new data to said pages of each said block in a random order.

22. The data storage system of claim 16, wherein said log is part of said data storage medium.

23. The data storage system of claim 16, wherein said copying to said log and said writing to said at least one unwritten page are effected using different respective writing modes.

24. A computer-readable storage medium having computer-readable code embodied in the computer-readable storage medium, the computer readable code for writing new data to at least one of a plurality of pages, of a data storage medium, at least a portion of which have respective risk zones, the computer-readable code comprising:
(a) program code for selecting at least one unwritten page for writing the new data;
(b) program code for, for each said unwritten page whose risk zone includes at least one written page, copying each said written page to a log that is separate from said at least one unwritten page; and
(c) program code for writing the new data to said at least one unwritten page.

25. A method of managing a memory that includes a plurality of pages, at least a portion of the pages having respective risk zones, the method comprising the steps of:
(a) selecting at least one unwritten page for writing new data;
(b) for each said unwritten page whose risk zone includes at least one written page, copying each said written page to a log; and
(c) writing said new data to said at least one unwritten page;
wherein said copying and said writing are effected using different respective writing modes; and wherein said writing mode of said copying writes fewer bits to a cell of the memory than said writing mode of said writing.

26. A data storage system, comprising:
(a) a data storage medium including a plurality of pages, at least a portion of said pages having respective risk zones;
(b) a log; and
(c) a controller for writing new data to said plurality of pages by steps including:
(i) selecting at least one unwritten page of said plurality of pages for writing said new data;
(ii) for each said unwritten page whose risk zone includes at least one written page of said plurality of pages, copying each said written page to said log; and
(iii) writing said new data to said at least one unwritten page of said plurality of pages;
wherein said copying to said log and said writing to said at least one unwritten page are effected using different respective writing modes; and wherein said writing mode of said copying to said log writes fewer bits to a cell of said data storage medium than said writing mode of said writing to said at least one unwritten page.

* * * * *